(12) United States Patent
Sasaki

(10) Patent No.: US 11,901,897 B2
(45) Date of Patent: Feb. 13, 2024

(54) INFORMATION PROCESSING APPARATUS AND NON-TRANSITORY COMPUTER READABLE MEDIUM

(71) Applicant: FUJIFILM BUSINESS INNOVATION CORP., Tokyo (JP)

(72) Inventor: Hirofumi Sasaki, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 399 days.

(21) Appl. No.: 17/154,070

(22) Filed: Jan. 21, 2021

(65) Prior Publication Data
US 2022/0069823 A1   Mar. 3, 2022

(30) Foreign Application Priority Data
Sep. 3, 2020   (JP) ................. 2020-148483

(51) Int. Cl.
*H03K 19/17758*   (2020.01)
*G06F 1/08*   (2006.01)
*G06F 1/20*   (2006.01)
*H03K 19/096*   (2006.01)
*H03K 19/1776*   (2020.01)

(52) U.S. Cl.
CPC ........ *H03K 19/17758* (2020.01); *G06F 1/08* (2013.01); *G06F 1/206* (2013.01); *H03K 19/096* (2013.01); *H03K 19/1776* (2013.01)

(58) Field of Classification Search
None
See application file for complete search history.

(56) References Cited

U.S. PATENT DOCUMENTS

| 8,761,526 | B2 | 6/2014 | Okuyama et al. | |
|---|---|---|---|---|
| 2005/0138445 | A1* | 6/2005 | Ooneda | H03K 19/17788 713/300 |
| 2014/0208143 | A1* | 7/2014 | Vorbach | G06F 1/324 713/322 |
| 2019/0043737 | A1* | 2/2019 | Hutton | G06F 1/20 |

FOREIGN PATENT DOCUMENTS

| JP | 3832557 B2 | 10/2006 |
|---|---|---|
| JP | 5786434 B2 | 9/2015 |
| JP | 2016-57828 A | 4/2016 |

* cited by examiner

*Primary Examiner* — Anh Q Tran
(74) *Attorney, Agent, or Firm* — Oliff PLC

(57) ABSTRACT

An information processing apparatus includes a processor connected to a programmable logic circuit. The processor is configured to: allow a first circuit reconfigured in a first region of the programmable logic circuit to execute a process; in parallel with the process of the first circuit, allow a second circuit to be reconfigured in a second region different from the first region; and adjust at least one of a clock frequency used in the process of the first circuit and a clock frequency used in reconfiguration of the second circuit so that a time point at which the process of the first circuit is completed and a time point at which the reconfiguration of the second circuit is completed will become closer to each other.

20 Claims, 11 Drawing Sheets

| MODULE | DATA | REGION | STATUS | 121 |
|---|---|---|---|---|
| M1 | D1 | R1 | RELEASED | |
| M2 | D2 | R2 | PROCESS | |
| M3 | D31 | R31 | RECONFIGURATION | |
| | D32 | R32 | WAITING (FOR RELEASE) | |
| M4 | D4 | R4 | WAITING (FOR PROCESS) | |

| ORDER | MODULE | START CONDITION | 122 |
|---|---|---|---|
| J1 | M1 | – | |
| J2 | M2 | COMPLETION OF J1 | |
| J3 | M3 | COMPLETION OF J2 | |
| J4 | M4 | COMPLETION OF J3 | |
| ... | ... | ... | |

INFORMATION PROCESSING APPARATUS AND NON-TRANSITORY COMPUTER READABLE MEDIUM

CROSS-REFERENCE TO RELATED APPLICATIONS

This application is based on and claims priority under 35 USC 119 from Japanese Patent Application No. 2020-148483 filed Sep. 3, 2020.

BACKGROUND

(i) Technical Field

The present disclosure relates to an information processing apparatus and a non-transitory computer readable medium.

(ii) Related Art

Japanese Patent No. 3832557 discloses a circuit reconfiguration method for a programmable logic circuit, including: for a circuit where there is a pre-circuit that has been previously reconfigured and a process thereof is being performed in at least part of a region where a circuit is to be reconfigured next, splitting data for reconfiguration between an overlapping portion that overlaps a region of the pre-circuit and a non-overlapping portion that does not overlap the region of the pre-circuit; reconfiguring the non-overlapping portion in parallel with the process of the pre-circuit; and, after completion of the process of the pre-circuit, reconfiguring the overlapping portion.

Japanese Unexamined Patent Application Publication No. 2016-57828 discloses an image processing apparatus that, upon completion of a process in any of a plurality of regions, reads, from memory, circuit configuration information corresponding to the region where the process has been completed, and allows the region to be reconfigured.

Japanese Patent No. 5786434 discloses an image data processing apparatus that, for a plurality of blocks that have been processed in the past, manages past record data representing the association of which circuit configuration data is selected for which block; based on the positional relationship between blocks included in the past record data, predicts, from a plurality of items of circuit configuration data prepared in advance, circuit configuration data that is highly likely to be selected for a block to be processed in the future; and loads the predicted circuit configuration data to circuit configuration memory of a reconfigurable processor.

If a process of an already reconfigured circuit in a certain part of a region and reconfiguration of another circuit in another region are performed in parallel, there may be a waiting time between the process and the reconfiguration.

SUMMARY

Aspects of non-limiting embodiments of the present disclosure relate to reducing a waiting time when reconfiguration is performed in parallel with a process, as compared to a mode in which a clock frequency remains unchanged.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided an information processing apparatus including a processor connected to a programmable logic circuit. The processor is configured to: allow a first circuit reconfigured in a first region of the programmable logic circuit to execute a process; in parallel with the process of the first circuit, allow a second circuit to be reconfigured in a second region different from the first region; and adjust at least one of a clock frequency used in the process of the first circuit and a clock frequency used in reconfiguration of the second circuit so that a time point at which the process of the first circuit is completed and a time point at which the reconfiguration of the second circuit is completed will become closer to each other.

BRIEF DESCRIPTION OF THE DRAWINGS

An exemplary embodiment of the present disclosure will be described in detail based on the following figures, wherein.

DETAILED DESCRIPTION

Exemplary Embodiment

Configuration of Information Processing Apparatus

Figure 1:
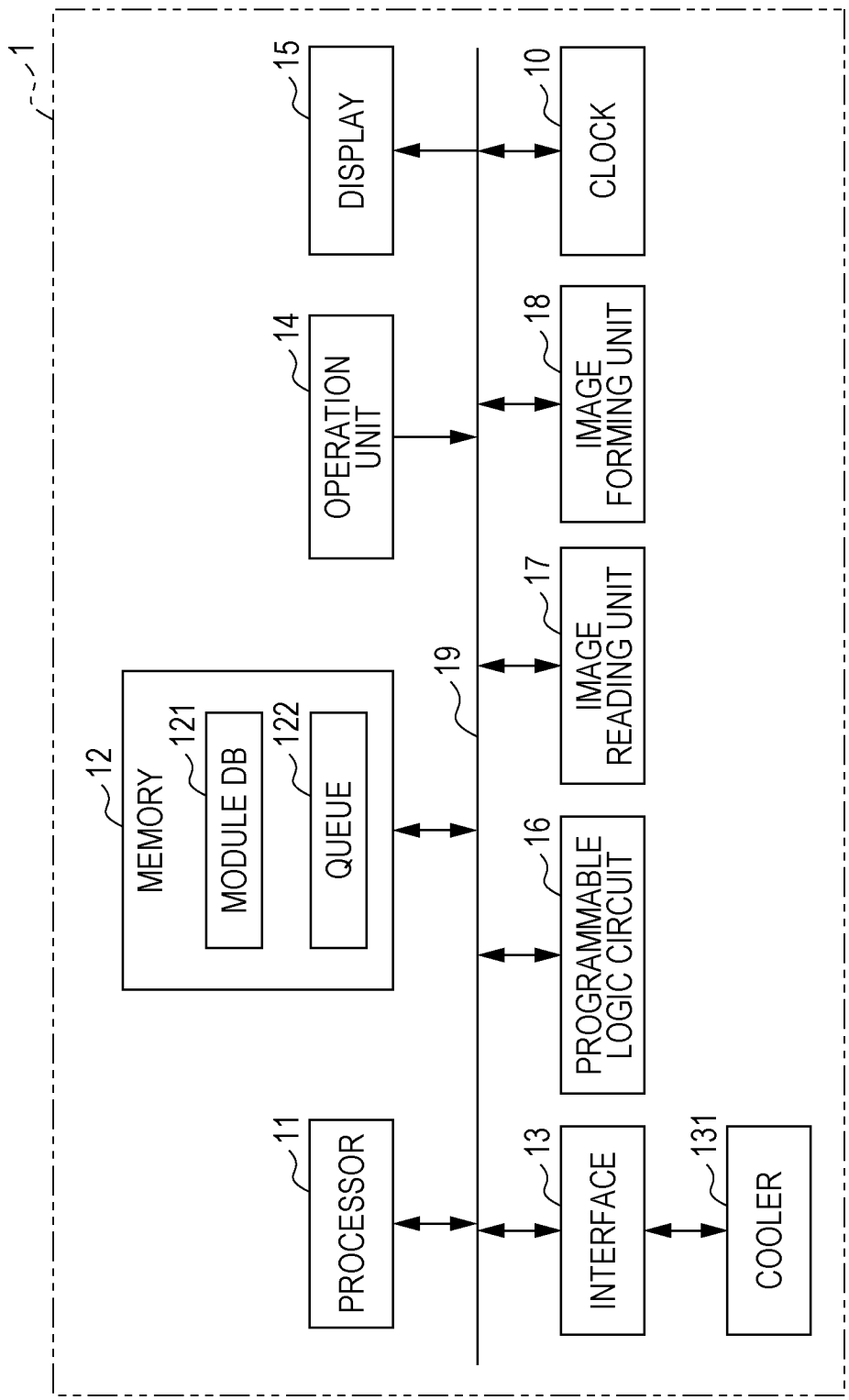
FIG. 1 is a diagram illustrating an example of the configuration of an information processing apparatus.

FIG. 1 is a diagram illustrating an example of the configuration of an information processing apparatus 1. The information processing apparatus 1 illustrated in FIG. 1 includes a clock 10, a processor 11, memory 12, an interface 13, an operation unit 14, a display 15, a programmable logic circuit 16, an image reading unit 17, and an image forming unit 18. These configurations are connected by a bus 19 so that they may be able to communicate with each other.

The bus 19 includes a host bus for connecting the processor 11 to a chipset (not illustrated), and a memory bus for connecting a memory controller (not illustrated) included in the chipset and the memory 12. In addition, the bus 19 includes a peripheral component interconnect (PCI) bus for connecting the processor 11 to the programmable logic circuit 16 and the like, and a host PCI bus bridge for connecting the PCI bus and the above-mentioned host bus. In addition, the bus 19 may also include an image bus for exchanging image data, which is used by the image reading unit 17 and the image forming unit 18.

The processor 11 controls each unit of the information processing apparatus 1 by reading and executing a program stored in the memory 12. The processor 11 is, for example, a central processing unit (CPU).

Figures 2, 3, 4:
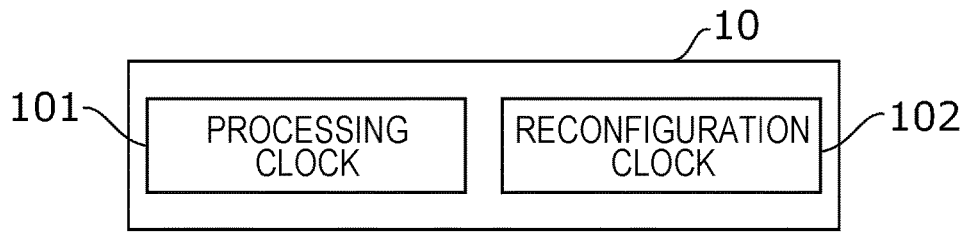
FIG. 2 is a diagram illustrating an example of a clock.
FIG. 3 is a diagram illustrating an example of a module database (DB)
FIG. 4 is a diagram illustrating an example of a queue.

The clock 10 is a configuration for supplying a clock signal to the processor 11 or the programmable logic circuit 16, and includes, for example, an oscillation circuit using a crystal oscillator. FIG. 2 is a diagram illustrating an example of the clock 10. The clock 10 includes a processing clock 101 and a reconfiguration clock 102.

The processing clock 101 determines a frequency used in operation when the programmable logic circuit 16 executes a process, generates a clock signal indicating the frequency, and supplies the clock signal to the programmable logic circuit 16. As the frequency (clock frequency) indicated by the clock signal increases, the speed at which the programmable logic circuit 16 executes a process increases, resulting in an earlier time point at which the process is completed.

The reconfiguration clock 102 determines a frequency used in operation when the processor 11 reconfigures a module in the programmable logic circuit 16, generates a clock signal indicating the frequency, and supplies the clock signal to the processor 11. The term "module" refers to a circuit that is reconfigured in a predetermined region of the programmable logic circuit 16 and that executes one predetermined process. As the clock frequency indicated by the clock signal increases, the speed at which the processor 11 reconfigures a module in the programmable logic circuit 16 increases, resulting in an earlier time point at which the reconfiguration is completed.

The memory 12 is storage that stores an operating system, various programs, data, and the like that are loaded to the processor 11. The memory 12 includes random-access memory (RAM) and read-only memory (ROM). Note that the memory 12 may also include a solid-state drive or a hard disk drive. In addition, the memory 12 stores a module DB 121 and a queue 122.

FIG. 3 is a diagram illustrating an example of the module DB 121. In the module DB 121, the module field is a field for storing identification information for identifying the above-mentioned module. The data field is a field for storing data (may also be referred to as configuration data) used when reconfiguring a corresponding module in the programmable logic circuit 16. The configuration data is separated by an amount to be reconfigured in one process.

One module includes one or more items of configuration data. For example, the module "M1" includes one item of data "D1"; however, the module "M3" includes two items of data "D31" and "D32". For that reason, the module "M1" becomes executable after reconfiguration of the data "D1", but the module "M3" becomes executable after reconfiguration, twice, of the data "D31" and the data "D32".

In the module DB 121, the region field is a field for storing information on a region where one or more items of configuration data included in a corresponding module are reconfigured in the programmable logic circuit 16. For example, when the data "D1" is written to the region "R1", the module "M1" is reconfigured in the programmable logic circuit 16. In addition, when the data "D31" is written to the region "R31" and the data "D32" is written to the region "R32", the module "M3" is reconfigured in the programmable logic circuit 16.

In the module DB 121, the status field is a field for storing the current status of configuration data included in a corresponding module. For example, the status of the data "D1" included in the module "M1" illustrated in FIG. 3 is "released". This means that execution of a process of the module "M1" is completed, and the region "R1" where the data "D1" is reconfigured is released.

In addition, for example, the status of the data "D2" included in the module "M2" illustrated in FIG. 3 is "process". This means that a process of the module "M2" has started but not been completed.

In addition, for example, the status of the data "D31", which is part of the module "M3" illustrated in FIG. 3, is "reconfiguration". This means that the data "D31" is being reconfigured.

In addition, for example, the status of the data "D32", which is part of the module "M3" illustrated in FIG. 3, is "waiting (for release)". This means that the writing of the data "D32" to the region "R32" is kept waiting for the release of the region in response to completion of a process of another module.

In addition, for example, the status of the data "D4" included in the module "M4" illustrated in FIG. 3 is "waiting (for process)". This means that the writing of the data "D4" included in the module "M4" to the region "R4" is kept waiting for the completion of a process of another module.

The above-mentioned "waiting (for release)" is waiting for the release of a data writing destination region, whereas "waiting (for process)" is waiting due to the fact that, as a condition for starting a process (start condition), completion of a process of a predetermined module is defined. Therefore, writing of data with the status "waiting (for process)" is required to wait for completion of a process of a predetermined module, regardless of whether that data's writing destination region is released or not.

FIG. 4 is a diagram illustrating an example of the queue 122. The queue 122 illustrated in FIG. 4 is a queue of modules for allowing the programmable logic circuit 16 to execute processes, which are arranged in the order of the processes. In the queue 122, the order field is a field for storing the order that the processes are executed by the programmable logic circuit 16. The module field is a field for storing the identification information of a module executed in a corresponding order. The start condition field is a field for storing the start condition of a corresponding module.

For example, in the queue 122 illustrated in FIG. 4, the order "J2" is the order that the module "M2" is executed, and the start condition thereof is "completion of J1". In other words, in order to start the process of the module "M2" in the order "J2", it is necessary that the process in the order "J1" be completed.

In the queue 122 illustrated in FIG. 4, the modules to be executed are arranged in the order "J1", "J2", "J3", and "J4", and the start condition from the order "J2" onward is completion of a process executed by the immediately preceding module. In other words, the queue 122 illustrated in FIG. 4 does not permit two or more processes among these four processes to be executed in parallel.

The interface 13 illustrated in FIG. 1 is a communication circuit that communicatively connects the information processing apparatus 1 to another apparatus via wire or wirelessly. For example, the interface 13 connects various devices to the processor 11 and allows the processor 11 to control these devices. In addition, the interface 13 illustrated in FIG. 1 communicatively connects to a cooler 131, and allows the processor 11 to control the cooler 131. The cooler 131 is a device that cools the processor 11 or the programmable logic circuit 16, and is a blower, a pump that circulates a refrigerant such as water, or the like.

The operation unit 14 includes operators such as operation buttons, a keyboard, a mouse, and a touchscreen for giving various commands. The operation unit 14 receives an operation and sends a signal in accordance with the operation content thereof to the processor 11.

The display 15 displays a specified image under control of the processor 11 or the programmable logic circuit 16. The display 15 illustrated in FIG. 1 includes a liquid crystal display, which is a display screen for displaying the above-mentioned image. A transparent touchscreen of the operation unit 14 may be arranged on the liquid crystal display in an overlapping manner.

The image reading unit 17 includes an irradiator such as a light-emitting diode (LED), an optical system such as a lens and a prism, and an imaging element such as a complementary metal oxide semiconductor (CMOS) image sensor or a charge-coupled device (CCD) image sensor. Under control of the processor 11 or the programmable logic circuit 16, the image reading unit 17 reads an image formed on a medium such as paper, generates image data indicating the read image, and supplies the image data to the processor 11.

Under control of the processor 11 or the programmable logic circuit 16, the image forming unit 18 forms an image on a medium such as paper using, for example, electrophotography.

The programmable logic circuit 16 is a logic circuit where a module for realizing a function is reconfigurable under control of the processor 11, and is, for example, a field programmable gate array (FPGA). The programmable logic circuit 16 illustrated in FIG. 1 controls at least one of the display 15, the image reading unit 17, and the image forming unit 18. Note that the targets controlled by the programmable logic circuit 16 are not limited to the foregoing units. In addition, the programmable logic circuit 16 need not control these units.

Figure 5:
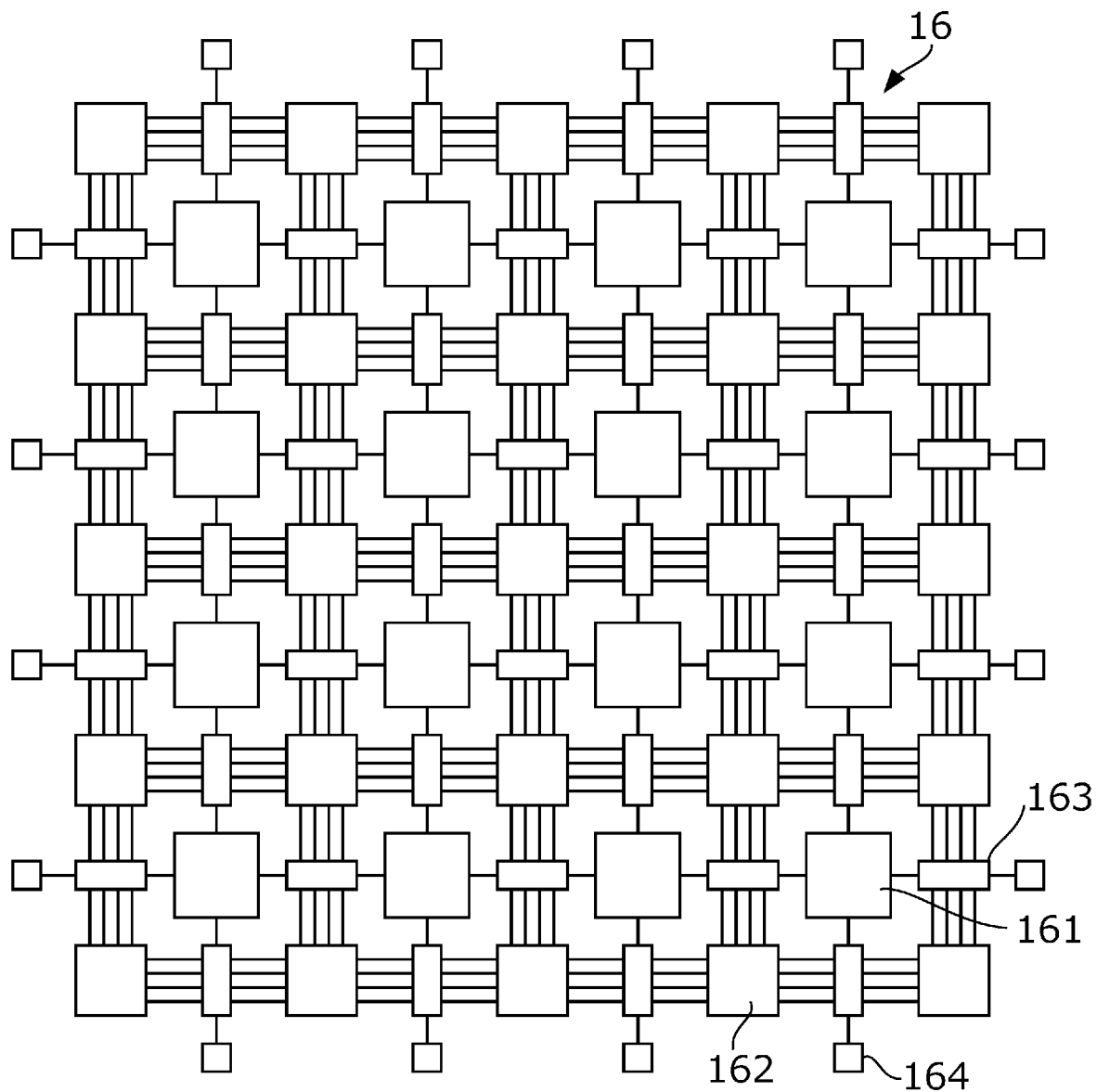
FIG. 5 is a diagram illustrating an example of a programmable logic circuit according to an exemplary embodiment.

FIG. 5 is a diagram illustrating an example of the configuration of the programmable logic circuit 16 according to the present exemplary embodiment. The programmable logic circuit 16 illustrated in FIG. 5 is a so-called island-style FPGA.

The programmable logic circuit 16 includes a plurality of logic blocks 161, switch blocks 162, connection blocks 163, and input/output terminals 164, which are respectively arranged in a grid pattern. That is, the programmable logic circuit 16 is an example of a programmable logic circuit including a plurality of logic blocks arranged in a grid pattern. Note that the programmable logic circuit 16 illustrated in FIG. 5 is only schematically illustrated, and the numbers of logic blocks 161 and so forth are not limited to those illustrated in FIG. 5.

The logic blocks 161 are blocks that serve as units for configuring modules for realizing various functions, such as logic and arithmetic circuits, memory circuits, and so forth using truth table circuits or the like.

The switch blocks 162 and the connection blocks 163 constitute a wiring region, along with wires connecting these blocks.

The switch blocks 162 are blocks for switching connections between wires. The connection blocks 163 are blocks for switching connections between the input/output of the logic blocks 161 and the above-mentioned wiring region.

The switch blocks 162 and the connection blocks 163 include, for example, switches using bus transistors, and configuration memories for controlling the switches.

The input/output terminals 164 are blocks that communicatively connect the programmable logic circuit 16 and the processor 11 and that serve as an interface for an input from the processor 11 and an output to the processor 11. The input/output terminals 164 illustrated in FIG. 5 are connected to the above-mentioned wiring region.

Note that the programmable logic circuit 16 may include, for example, a digital signal processor (DSP) used for executing a predetermined process.

The processor 11 reconfigures the programmable logic circuit 16 by writing configuration data stored in the memory 12 respectively to the logic blocks 161, the switch blocks 162, and the connection blocks 163 of the programmable logic circuit 16.

Figure 6:
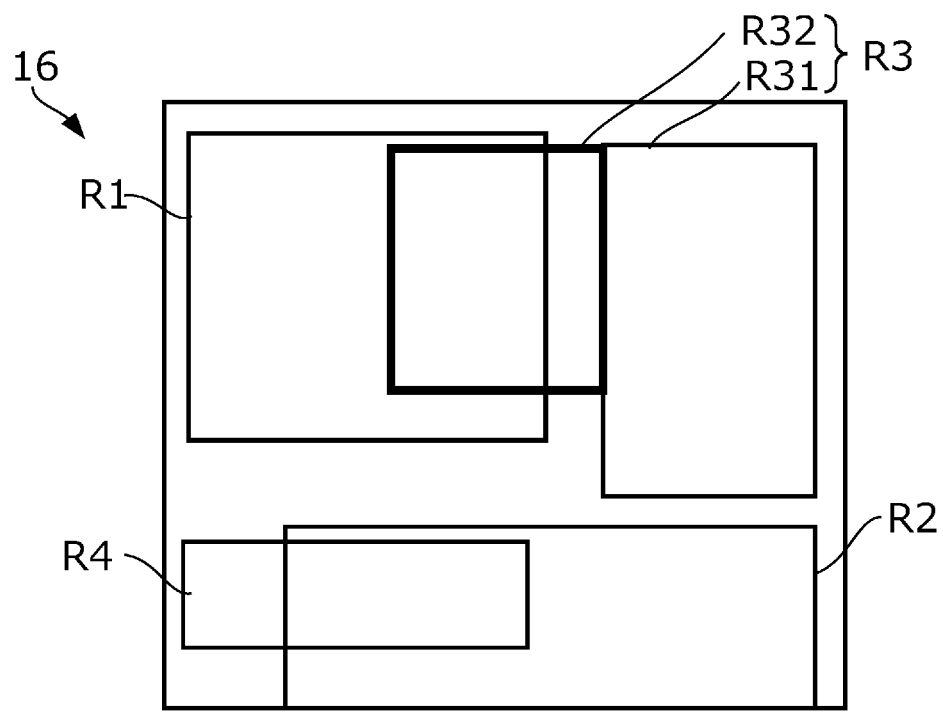
FIG. 6 is a diagram illustrating an example of regions of the programmable logic circuit.

FIG. 6 is a diagram illustrating an example of regions of the programmable logic circuit 16. FIG. 6 illustrates an example of regions R1, R2, R31, R32, and R4 of the module DB 121 illustrated in FIG. 3. In the programmable logic circuit 16, the region R31 and the region R32 constitute a region R3.

The region R1 and the region R32 have an overlapping portion, but the region R1 and the region R31 do not have an overlapping portion. Therefore, during execution of a process of the module "M1" reconfigured in the region R1, the processor 11 is unable to write the data "D32" to the region R32, but is able to write the data "D31" to the region R31.

In addition, the region R2 and the region R4 have an overlapping portion. Therefore, during execution of a process of the module "M2" reconfigured in the region R2, the processor 11 is unable to write the data "D4" to the region R4. In addition, during execution of a process of the module "M4" reconfigured in the region R4, the processor 11 is unable to write the data "D2" to the region R2.

Functional Configuration of Information Processing Apparatus

Figure 7:
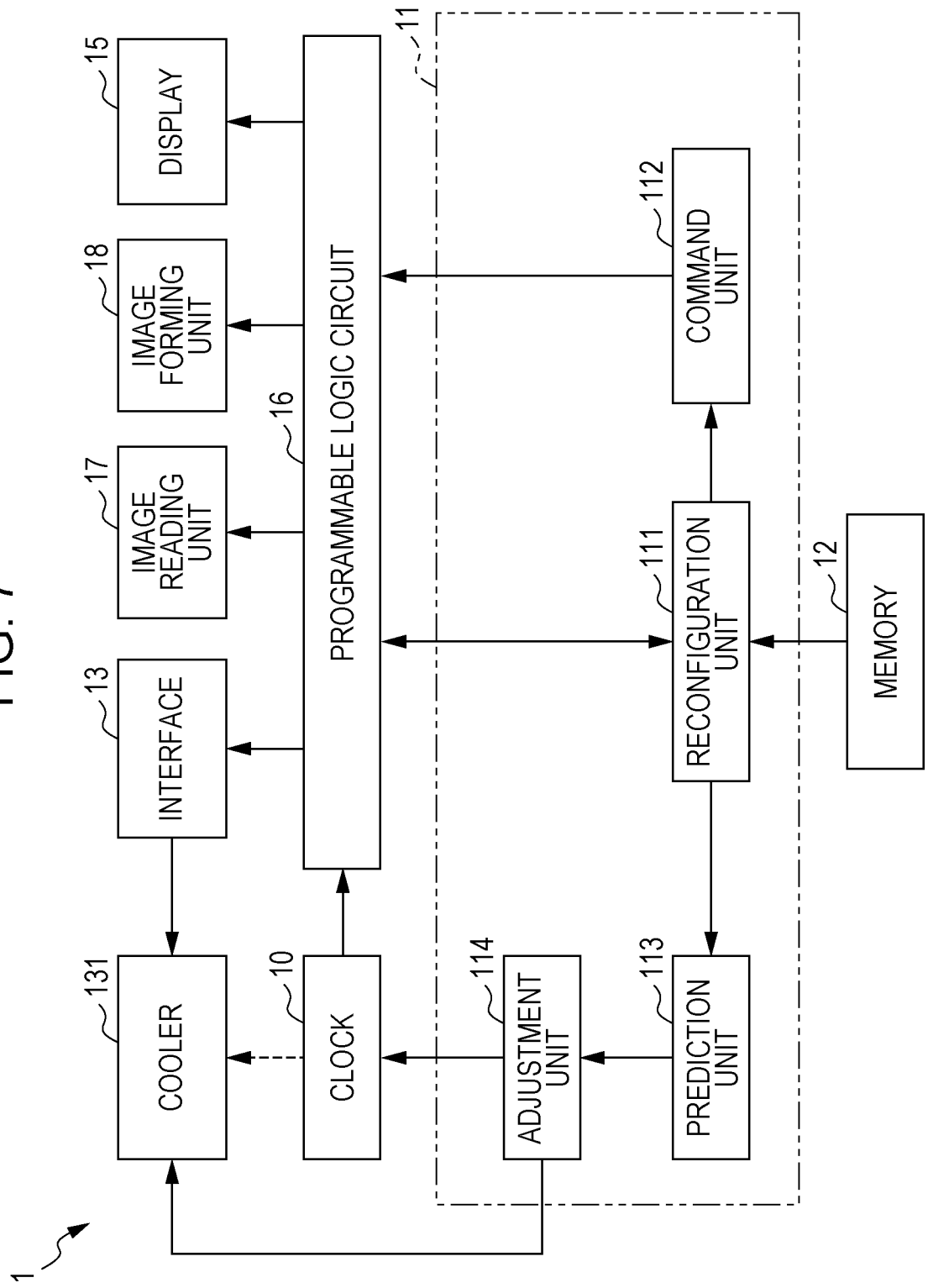
FIG. 7 is a diagram illustrating an example of the functional configuration of the information processing apparatus.

FIG. 7 is a diagram illustrating an example of the functional configuration of the information processing apparatus 1. The processor 11 of the information processing apparatus 1 executes a program stored in the memory 12, thereby functioning as a reconfiguration unit 111, a command unit 112, a prediction unit 113, and an adjustment unit 114.

The reconfiguration unit 111 reads configuration data from the memory 12, writes the configuration data to a region corresponding to the configuration data in the programmable logic circuit 16, and reconfigures a module.

In response to completion of the reconfiguration by the above-mentioned reconfiguration unit 111, the command unit 112 gives a command to execute a process to a circuit realized by the reconfigured module.

In the case where the reconfiguration of a module by the above-mentioned reconfiguration unit 111 and a process commanded by the command unit 112 are performed in parallel, the prediction unit 113 predicts a time point at which the reconfiguration is completed and a time point at which the process is completed.

The adjustment unit 114 adjusts the clock frequency of the clock 10 in accordance with the result of predicting each time point by the above-mentioned prediction unit 113. In addition, the adjustment unit 114 illustrated in FIG. 7 adjusts the heat exchange amount of the cooler 131 connected to the interface 13, along with the adjustment of the clock 10.

In the case where the cooler 131 increases/decreases its heat exchange amount in accordance with the clock signal supplied from the clock 10, the adjustment unit 114 controls the clock 10 to adjust the clock signal supplied to the cooler 131.

Operation of Information Processing Apparatus

The processor 11 of the information processing apparatus 1 reads a program stored in the memory 12 to perform the operation of reconfiguring a circuit in a predetermined region of the programmable logic circuit 16, allowing the reconfigured circuit to execute a process, and adjusting the clock frequency for the process and reconfiguration.

Figure 8:
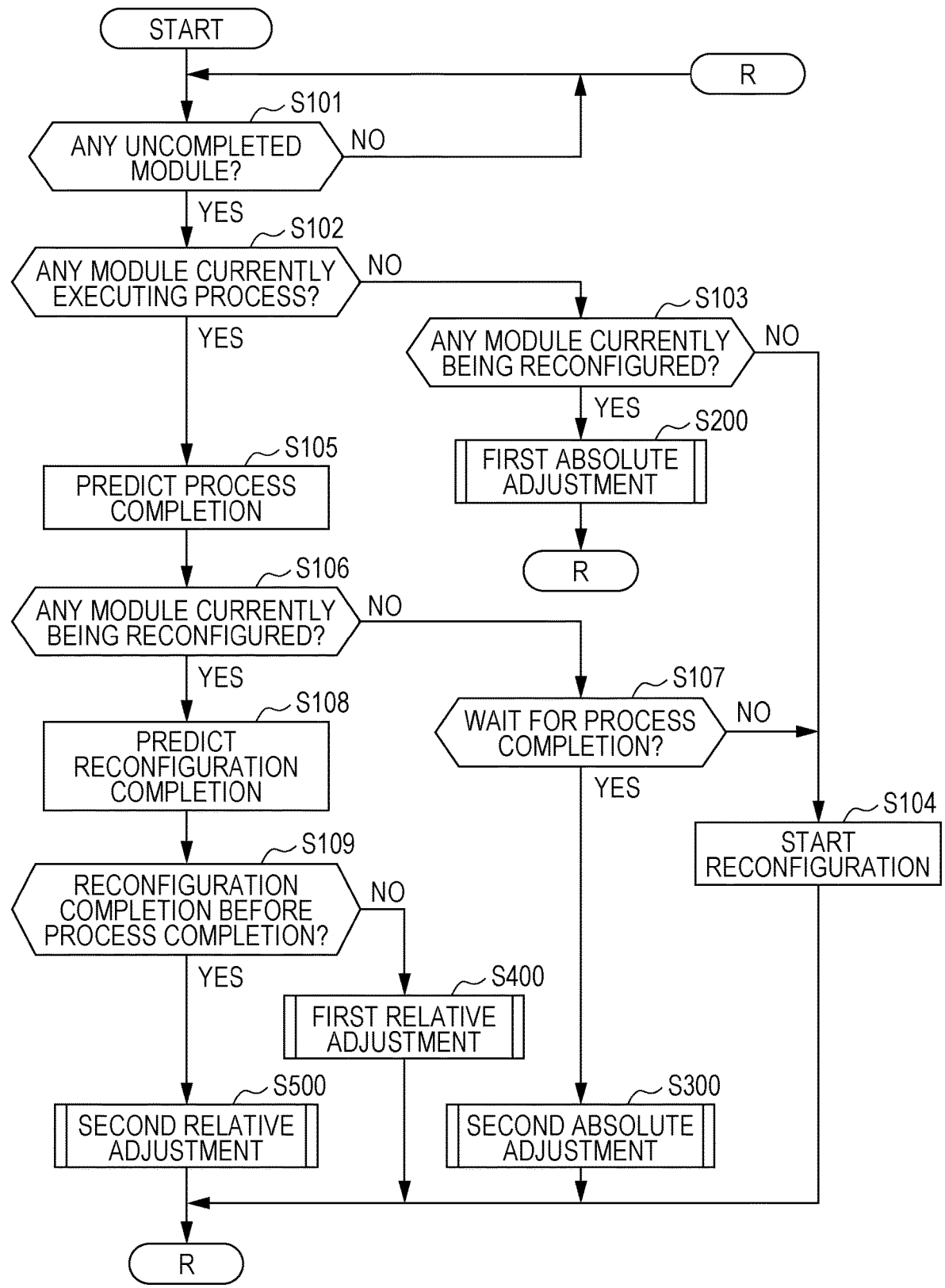
FIG. 8 is a flowchart illustrating an example of the flow of the operation performed by the information processing apparatus 1 to adjust a clock frequency.

FIG. 8 is a flowchart illustrating an example of the flow of the operation performed by the information processing apparatus 1 to adjust the clock frequency. The processor 11 of the information processing apparatus 1 receives, for example, a user operation from the operation unit 14, and stores a process indicated by the received operation in the queue 122 in the memory 12. The processor 11 refers to the queue 122 in the memory 12 and determines whether there is any uncompleted module (step S101).

In the case where it is determined that there is no uncompleted module in the queue 122 (NO in step S101), the processor 11 repeats this determination. In contrast, in the case where it is determined that there is/are one or more uncompleted modules in the queue 122 (YES in step S101), the processor 11 determines whether there is any module currently executing a process among the uncompleted module(s) (step S102).

In the case where there is no module that is uncompleted and that is currently executing a process (NO in step S102), the processor 11 determines whether there is a module currently being reconfigured among the uncompleted module(s) in the queue 122 (step S103).

In the case where it is determined that there is no module currently being reconfigured (NO in step S103), the processor 11 starts reconfiguration of any module in accordance with the order indicated in the queue 122 (step S104).

In contrast, in the case where it is determined that there is a module currently being reconfigured (YES in step S103), the processor 11 performs adjustment (first absolute adjustment) of a clock frequency generated by the reconfiguration clock 102 included in the clock 10 (step S200). In response to completion of the first absolute adjustment, the processor 11 brings the process back to step S101, as illustrated in FIG. 8.

Here, "absolute adjustment" is not adjustment for bringing a time point at which a process is completed and a time point at which reconfiguration is completed relatively closer to each other, but is adjustment of any of the two time points.

Figure 9A:
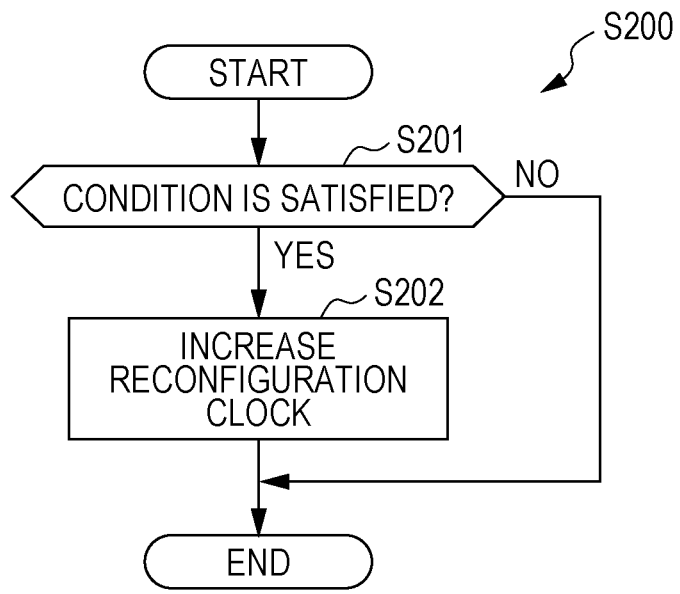
FIGS. 9A and 9B are flowcharts illustrating an example of the flow of an absolute adjustment operation.
Figure 9B:
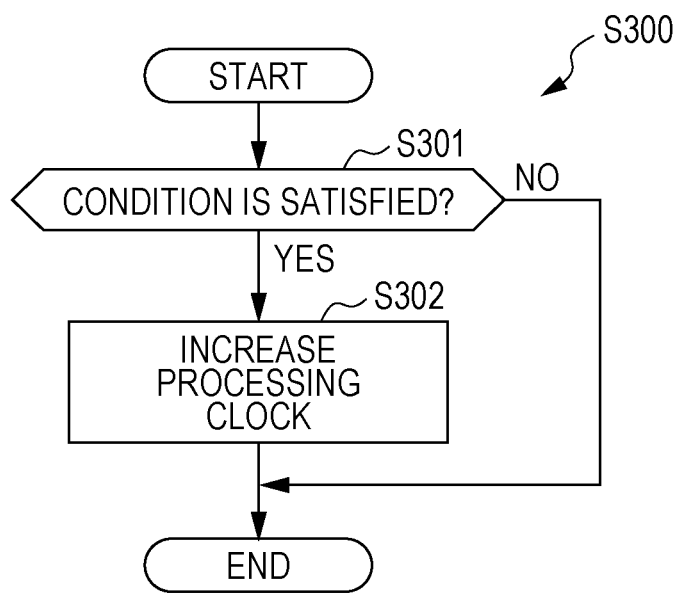

FIGS. 9A and 9B are flowcharts illustrating an example of the flow of an absolute adjustment operation. FIG. 9A illustrates an example of the flow of the operation of the above-mentioned first absolute adjustment. The first absolute adjustment illustrated in FIG. 9A is adjustment for increasing the clock frequency of the reconfiguration clock 102. That is, when performing the first absolute adjustment, the processor 11 determines whether a condition is satisfied (step S201), and, in the case where it is determined that the condition is satisfied (YES in step S201), increases the clock frequency of the reconfiguration clock 102 (step S202).

This condition is a condition for performing step S202, and is, for example, the condition that the clock frequency of the reconfiguration clock 102 has not reached a predetermined upper limit. In the case where it is determined that the condition is not satisfied (NO in step S201), the processor 11 ends the process without performing the adjustment.

In step S102 illustrated in the flowchart illustrated in FIG. 8, in the case where it is determined that there is a module that is uncompleted and that is currently executing a process (YES in step S102), the processor 11 predicts a time point at which the process is completed (step S105).

Next, the processor 11 determines whether there is any module that is uncompleted and that is currently being reconfigured (step S106). In the case where it is determined that there is no module that is currently being reconfigured (NO in step S106), the processor 11 determines whether the reason for this is waiting for completion of a process executed by a module currently executing the process (step S107).

In a region where a module currently executing a process is reconfigured, no new configuration data is allowed to be written until the process of the module is completed. Therefore, in the case where it is determined that the reason is waiting for completion of the process (YES in step S107), the processor 11 performs adjustment (second absolute adjustment) of a clock frequency generated by the processing clock 101 included in the clock 10 (step S300). In response to completion of the second absolute adjustment, the processor 11 brings the process back to step S101, as illustrated in FIG. 8.

FIG. 9B illustrates an example of the flow of the operation of the above-mentioned second absolute adjustment. The second absolute adjustment illustrated in FIG. 9B is adjustment for increasing the clock frequency of the processing clock 101. That is, when performing the second absolute adjustment, the processor 11 determines whether a condition is satisfied (step S301), and, in the case where it is determined that the condition is satisfied (YES in step S301), increases the clock frequency of the processing clock 101 (step S302).

This condition is a condition for performing step S302, and is, for example, the condition that the clock frequency of the processing clock 101 has not reached a predetermined upper limit. In the case where it is determined that the condition is not satisfied (NO in step S301), the processor 11 ends the process without performing the adjustment.

In step S107 illustrated in FIG. 8, in the case where it is determined that the reason is not waiting for completion of the above-mentioned process (NO in step S107), the processor 11 starts reconfiguration of any module in accordance with the order indicated in the queue 122 (step S104).

In step S106 illustrated in FIG. 8, in the case where it is determined that there is a module that is currently being reconfigured (YES in step S106), the processor 11 predicts a time point at which the reconfiguration is completed (step S108).

The processor 11 compares the time point at which the process is completed, which is predicted in step S105, and the time point at which the reconfiguration is completed, which is predicted in step S108, and determines whether completion of the reconfiguration is earlier than completion of the process (step S109).

In the case where it is determined that completion of the reconfiguration is not earlier than completion of the process (NO in step S109), the processor 11 performs adjustment (first relative adjustment) of the clock frequency generated by the clock 10 so that the time point at which the process is completed and the time point at which the reconfiguration is completed will become relatively closer to each other (step S400). In response to completion of the first relative adjustment, the processor 11 brings the process back to step S101, as illustrated in FIG. 8.

Here, "relative adjustment" is adjustment of a clock frequency generated by at least one of the processing clock 101 and the reconfiguration clock 102 to bring the time point at which the process is completed and the time point at which the reconfiguration is completed relatively closer to each other.

Figure 10:
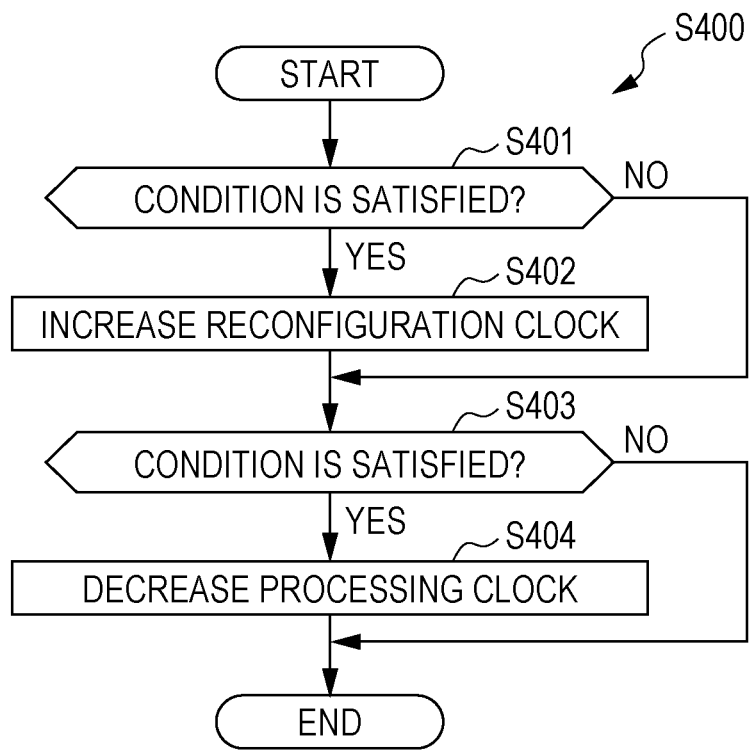
FIG. 10 is a flowchart illustrating an example of the flow of a first relative adjustment operation.

FIG. 10 is a flowchart illustrating an example of the flow of a first relative adjustment operation. When performing the first relative adjustment illustrated in FIG. 10, the processor 11 determines whether a condition is satisfied (step S401). This condition is a condition for performing step S402, and is, for example, the condition that the clock frequency of the reconfiguration clock 102 has not reached a predetermined upper limit.

In the case where it is determined that the condition is satisfied (YES in step S401), the processor 11 increases the clock frequency of the reconfiguration clock 102 (step S402), and brings the process forward to step S403.

In contrast, in the case where it is determined that the condition is not satisfied (NO in step S401), the processor 11 brings the process forward to step S403 without performing the processing in step S402.

The processor 11 determines whether a condition is satisfied (step S403). This condition is a condition for performing step S404, and is, for example, the condition that the clock frequency of the processing clock 101 has not reached a predetermined lower limit.

In the case where it is determined that the condition is satisfied (YES in step S403), the processor 11 decreases the clock frequency of the processing clock 101 (step S404), and ends the process.

In contrast, in the case where it is determined that the condition is not satisfied (NO in step S403), the processor 11 ends the process without performing the processing in step S404.

In step S109 illustrated in FIG. 8, in the case where it is determined that completion of the reconfiguration is earlier than completion of the process (YES in step S109), the processor 11 performs adjustment (second relative adjustment) of the clock frequency generated by the clock 10 so that the time point at which the process is completed and the time point at which the reconfiguration is completed will become relatively closer to each other (step S500). In response to completion of the second relative adjustment, the processor 11 brings the process back to step S101, as illustrated in FIG. 8.

Figure 11:
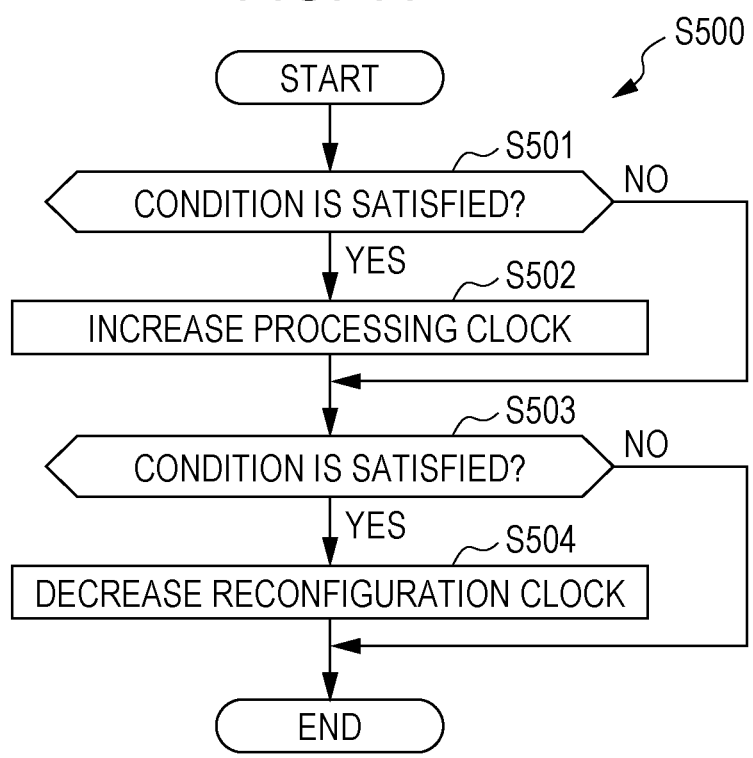
FIG. 11 is a flowchart illustrating an example of the flow of a second relative adjustment operation.

FIG. 11 is a flowchart illustrating an example of the flow of a second relative adjustment operation. When performing the second relative adjustment illustrated in FIG. 11, the processor 11 determines whether a condition is satisfied (step S501). This condition is a condition for performing step S502, and is, for example, the condition that the clock frequency of the processing clock 101 has not reached a predetermined upper limit.

In the case where it is determined that the condition is satisfied (YES in step S501), the processor 11 increases the clock frequency of the processing clock 101 (step S502), and brings the process forward to step S503.

In contrast, in the case where it is determined that the condition is not satisfied (NO in step S501), the processor 11 brings the process forward to step S503 without performing the processing in step S502.

The processor 11 determines whether a condition is satisfied (step S503). This condition is a condition for performing step S504, and is, for example, the condition that the clock frequency of the reconfiguration clock 102 has not reached a predetermined lower limit.

In the case where it is determined that the condition is satisfied (YES in step S503), the processor 11 decreases the clock frequency of the reconfiguration clock 102 (step S504), and ends the process.

In contrast, in the case where it is determined that the condition is not satisfied (NO in step S503), the processor 11 ends the process without of performing the processing in step S504.

Although both the processing clock 101 and the reconfiguration clock 102 are adjusted in the above-mentioned first relative adjustment and second relative adjustment, only one of the processing clock 101 and the reconfiguration clock 102 may be adjusted.

Figure 12:
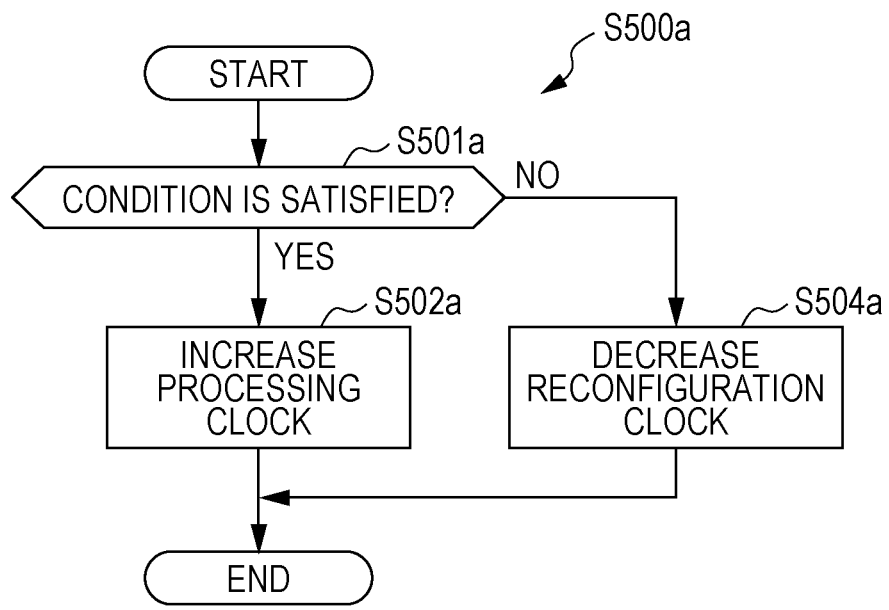
FIG. 12 is a flowchart illustrating an example of the flow of the second relative adjustment operation for adjusting either a processing clock or a reconfiguration clock.

FIG. 12 is a flowchart illustrating an example of the flow of the second relative adjustment operation for adjusting either the processing clock 101 or the reconfiguration clock 102. In the second relative adjustment (step S500a), the processor 11 determines whether a condition is satisfied (step S501a). This condition is a condition for performing step S502a.

In the case where it is determined that the condition is satisfied (YES in step S501a), the processor 11 increases the clock frequency of the processing clock 101 (step S502a), and ends the process.

In contrast, in the case where it is determined that the condition is not satisfied (NO in step S501a), the processor 11 decreases the clock frequency of the reconfiguration clock 102 (step S504a), and ends the process.

Figure 13:
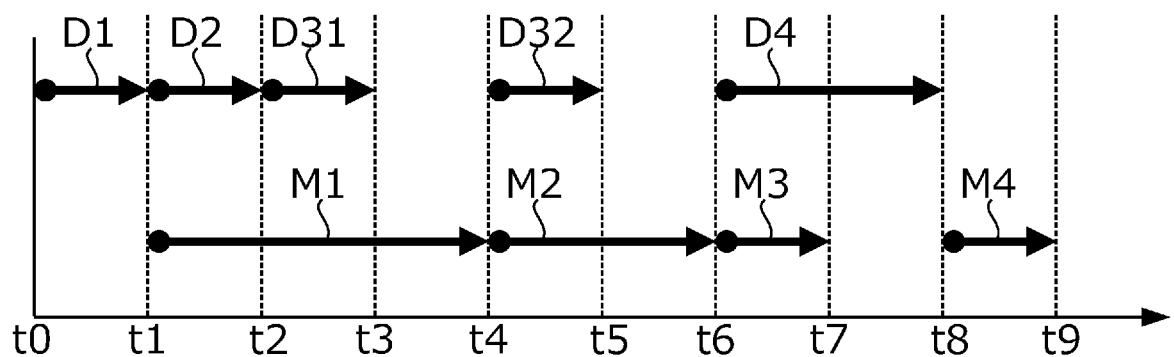
FIG. 13 is a diagram illustrating the progress of a process and reconfiguration in the case where no clock frequency adjustment is performed.

FIG. 13 is a diagram illustrating the progress of a process and reconfiguration in the case where no clock frequency adjustment is performed. The horizontal axis in FIG. 13 indicates time. The upper line in FIG. 13 indicates the progress of reconfiguration. The lower line in FIG. 13 indicates the progress of a process.

For example, the processor 11 of the information processing apparatus 1 starts writing the data "D1" to the region R1 at time to, as illustrated in FIG. 13. In response to completion of the writing at time t1, the processor 11 gives a command to the programmable logic circuit 16 to start the process of the module "M1". It is predicted that the process of the module "M1" will not be completed until time t4.

In contrast, the processor 11 starts writing the data "D2" to the region R2 at time t1. It is predicted that the writing of the data "D2" will not be completed until time t2.

In addition, the processor 11 starts writing the data "D31" to the region R31 at time t2 at which the writing of the data "D2" is completed. It is predicted that the writing of the data "D31" will not be completed until time t3.

In this case, time t2 at which the writing of the data "D2" is completed (that is, reconfiguration of the module "M2" is completed) is earlier than time t4 at which the process of the module "M1" is completed. To this end, the processor 11 brings time t2 and time t4 closer to each other by increasing the clock frequency of the processing clock 101, which is used in the process of the module "M1", decreasing the clock frequency of the reconfiguration clock 102, which is used in reconfiguration of the module "M2", or performing both.

In addition, in the example illustrated in FIG. 13, time t3 at which the writing of the data "D31" is completed is earlier than time t4. To this end, as described above, the processor 11 brings time t3 and time t4 closer to each other by increasing the clock frequency of the processing clock 101, decreasing the clock frequency of the reconfiguration clock 102, or performing both.

Figure 14A:
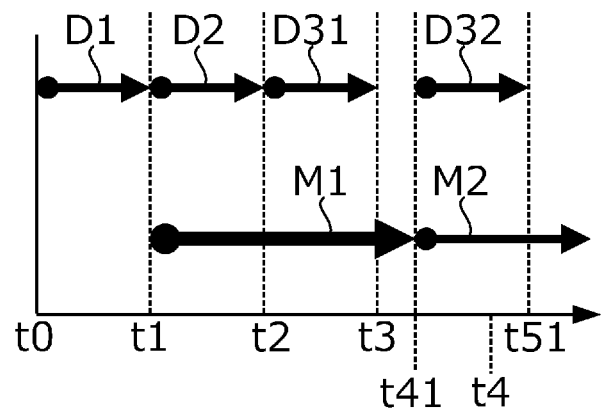
FIGS. 14A and 14B are diagrams illustrating an example of adjustment in the case where reconfiguration is completed before a process is completed.
Figure 14B:
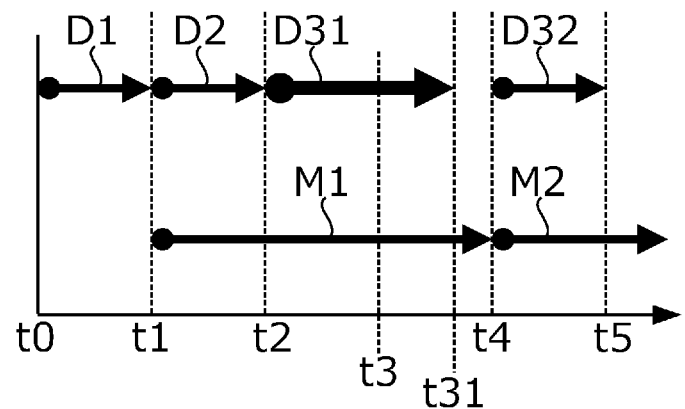

FIGS. 14A and 14B are diagrams illustrating an example of adjustment in the case where reconfiguration is completed before a process is completed. FIG. 14A illustrates a progress when the clock frequency of the processing clock 101, which is used in the process of the module "M1", is increased to hasten the completion of the process.

As described above, in the case where the clock frequency remains unchanged, the process of the module "M1" is completed at time t4; however, the process is completed at time t41 when the clock frequency is increased. Time t41 is time earlier than time t4 and later than time t3. Accordingly, time t3 at which reconfiguration of the data "D31" is completed and time t41 at which the process of the module "M1" is completed are brought closer to each other, compared to the situation before adjustment of the clock frequency. Therefore, the waiting time until the next data "D32" is reconfigured is shortened.

The processor 11 is an example of a processor that, in the case where it is predicted that completion of reconfiguration of a second circuit is earlier than completion of a process of a first circuit, increases a clock frequency used in the process of the first circuit.

In addition, FIG. 14B illustrates a progress when the clock frequency of the reconfiguration clock 102, which is used in writing of the data "D31", is decreased to delay the completion of reconfiguration of a module including the data.

By decreasing the clock frequency, a time point at which writing of the data "D31" is completed is delayed from time t3 to time t31. Time t31 is time later than time t3 and earlier than time t4. Accordingly, time t31 at which reconfiguration of the data "D31" is completed and time t4 at which the process of the module "M1" is completed are brought closer to each other, compared to the situation before adjustment of the clock frequency. Therefore, the waiting time until the next data "D32" is reconfigured is shortened. In addition, since the clock frequency is decreased, the power consumption is saved, compared to the case where the clock frequency remains unchanged.

The processor 11 is an example of a processor that, in the case where it is predicted that completion of reconfiguration of a second circuit is earlier than completion of a process of a first circuit, decreases a clock frequency used in reconfiguration of the second circuit.

In addition, in the example illustrated in FIG. 13, the processor 11 of the information processing apparatus 1 completes the process of the module "M2" at time t6. The region R2 where the module "M2" is reconfigured partly overlaps the region R4 where the module "M4" is reconfigured. For that reason, reconfiguration of the module "M4" is unable to start until time t6 at which the process of the module "M2" is completed.

In addition, as in the queue 122 illustrated in FIG. 4, the process of the module "M3" performed in the order "J3" starts on the start condition that the process in the order "J2" is completed. For that reason, as illustrated in FIG. 13, even if reconfiguration of the module "M3" is completed at time t5, the process thereof is unable to start until time t6 at which the process of the module "M2" is completed.

Therefore, the processor 11 starts writing the data "D4" to the region R4 at time t6, thereby starting reconfiguration of the module "M4". In addition, at time t6, the processor 11 starts the process of the module "M3" whose reconfiguration has been completed at time t5.

Here, it is predicted that reconfiguration of the module "M4" will be completed at time t8. In addition, it is predicted that the process of the module "M3" will be completed at time t7. Time t7 is time earlier than time t8.

In short, in this case, time t7 at which the process of the module "M3" is completed is earlier than time t8 at which reconfiguration of the module "M4" is completed. To this end, the processor 11 brings time t7 and time t8 closer to each other by increasing the clock frequency of the reconfiguration clock 102, which is used in reconfiguration of the module "M4", decreasing the clock frequency of the processing clock 101, which is used in the process of the module "M3", or performing both.

Figure 15A:
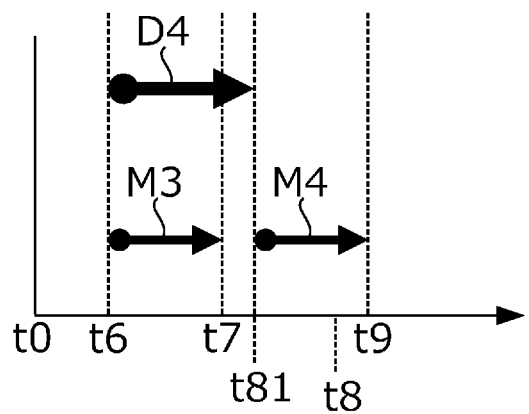
FIGS. 15A and 15B are diagrams illustrating an example of adjustment in the case where a process is completed before reconfiguration is completed.
Figure 15B:
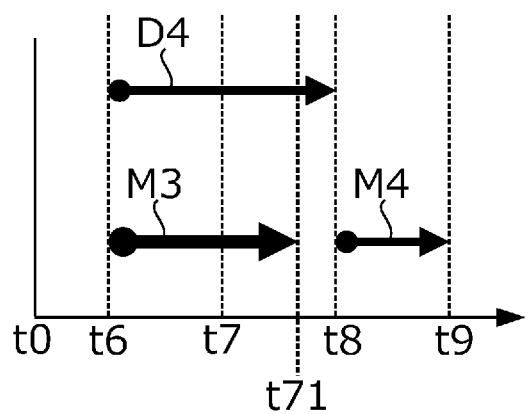

FIGS. 15A and 15B are diagrams illustrating an example of adjustment in the case where a process is completed before reconfiguration is completed. FIG. 15A illustrates a progress when the clock frequency of the reconfiguration clock 102, which is used in reconfiguration of the module "M4", is increased to hasten the completion of the reconfiguration.

As described above, in the case where the clock frequency remains unchanged, reconfiguration of the module "M4" is completed at time t8; however, the reconfiguration is completed at time t81 when the clock frequency is increased. Time t81 is time earlier than time t8 and later than time t7. Accordingly, time t81 at which reconfiguration of the module "M4" is completed and time t7 at which the process of the module "M3" is completed are brought closer to each other, compared to the situation before adjustment of the clock frequency. Therefore, the waiting time until the process of the reconfigured module "M4" starts is shortened.

The processor 11 is an example of a processor that, in the case where it is predicted that completion of a process of a first circuit is earlier than completion of reconfiguration of a second circuit, increases a clock frequency used in reconfiguration of the second circuit.

FIG. 15B illustrates a progress when the clock frequency of the processing clock 101, which is used in the process of the module "M3", is decreased to delay the completion of the process.

By decreasing the clock frequency, a time point at which the process of the module "M3" is completed is delayed from time t7 to time t71. Time t71 is time later than time t7 and earlier than time t8. Accordingly, time t71 at which the process of the module "M3" is completed and time t8 at which reconfiguration of the module "M4" is completed are brought closer to each other, compared to the situation before adjustment of the clock frequency. Therefore, the waiting time until the process of the reconfigured module "M4" starts is shortened. In addition, since the clock frequency is decreased, the power consumption is saved, compared to the case where the clock frequency remains unchanged.

The processor 11 is an example of a processor that, in the case where it is predicted that completion of a process of a first circuit is earlier than completion of reconfiguration of a second circuit, decreases a clock frequency used in the process of the first circuit.

With the above-described operation, the processor 11 of the information processing apparatus 1 allows a circuit (first circuit) reconfigured in any (first region) of regions of the programmable logic circuit 16 to execute a process. In addition, in parallel with the process of the first circuit, the processor 11 allows a circuit (second circuit) different from the first circuit to be reconfigured in a region (second region) different from the first region of the programmable logic circuit 16. The processor 11 adjusts at least one of a clock frequency used in the process of the first circuit and a clock frequency used in reconfiguration of the second circuit so that a time point at which the process of the first circuit is completed and a time point at which the reconfiguration of the second circuit is completed will become closer to each other. Accordingly, compared to an apparats where the clock frequency remains unchanged, the waiting time is reduced in the information processing apparatus 1 when reconfiguration is performed in parallel with the process.

Modifications

So far is the description of the exemplary embodiment; now, the content of the exemplary embodiment may be modified as follows. In addition, the following modifications may be combined with one another.

First Modification

Although the information processing apparatus 1 includes the processor 11 including a CPU in the above-described exemplary embodiment, a controller that controls the information processing apparatus 1 may be other configurations. For example, the information processing apparatus 1 may include various processors other than a CPU.

In the embodiments above, the term "processor" refers to hardware in a broad sense. Examples of the processor include general processors (e.g., CPU: Central Processing Unit) and dedicated processors (e.g., GPU: Graphics Processing Unit, ASIC: Application Specific Integrated Circuit, FPGA: Field Programmable Gate Array, and programmable logic device).

Second Modification

In the embodiments above, the term "processor" is broad enough to encompass one processor or plural processors in collaboration which are located physically apart from each other but may work cooperatively.

The order of operations of the processor is not limited to one described in the embodiments above, and may be changed.

Third Modification

In the above-described exemplary embodiment, the processor 11 allows a second circuit to be reconfigured in a second region in parallel with a process of a first circuit reconfigured in a first region of the programmable logic circuit 16, and adjusts the clock frequency so that a time point at which the process of the first circuit is completed and a time point at which the reconfiguration of the second circuit is completed will become closer to each other. Alternatively, the heat exchange amount of the cooler 131 may be adjusted along with the adjustment of the clock frequency. That is, the processor 11 is an example of a processor that adjusts a heat exchange amount of a cooler that cools the processor 11 in response to adjustment of a clock frequency.

For example, in the case where the cooler 131 illustrated in FIG. 1 is a blower that blows outside air to the processor 11 and the programmable logic circuit 16, when increasing the clock frequency, the processor 11 increases the amount of blown air to increase the heat exchange amount of the cooler 131 so that the heat increased due to an increase in the clock frequency dissipates to the outside.

The processor 11 is an example of a processor that increases an amount of blown air of the blower when increasing the clock frequency.

In addition, when the processor 11 decreases the clock frequency, the heat generated decreases; thus, the heat exchange amount may be reduced, as compared to that before decreasing the clock frequency. In this case, the processor 11 decreases the clock frequency, as well as the amount of blown air, thereby reducing the heat exchange amount of the cooler 131.

Fourth Modification

In the above-described exemplary embodiment, a program executed by the processor 11 of the information processing apparatus 1 is an example of a program that causes a computer including a processor connected to a programmable logic circuit to execute a process, the process including: allowing a first circuit reconfigured in a first region of the programmable logic circuit to execute a process; in parallel with the process of the first circuit, allowing a second circuit to be reconfigured in a second region different from the first region; and adjusting at least one of a clock frequency used in the process of the first circuit and a clock frequency used in reconfiguration of the second circuit so that a time point at which the process of the first circuit is completed and a time point at which the reconfiguration of the second circuit is completed will become closer to each other.

The program may be provided in a state where the program is recorded on a computer-readable recording medium such as a magnetic recording medium including a magnetic tape and a magnetic disk, an optical recording medium including an optical disk, a magneto-optical recording medium, and semiconductor memory. In addition, the program may be downloaded via a communication line such as the Internet.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. An information processing apparatus comprising:
   a processor connected to a programmable logic circuit, the processor being configured to
   allow a first circuit reconfigured in a first region of the programmable logic circuit to execute a process,
   in parallel with the process of the first circuit, allow a second circuit to be reconfigured in a second region different from the first region, and
   adjust at least one of a clock frequency used in the process of the first circuit and a clock frequency used in reconfiguration of the second circuit so that a time point at which the process of the first circuit is completed and a time point at which the reconfiguration of the second circuit is completed will become closer to each other.

2. The information processing apparatus according to claim 1, wherein the processor is configured to adjust the clock frequency used in the reconfiguration of the second circuit so that the time point at which the reconfiguration of the second circuit is completed becomes closer to the time point at which the process of the first circuit is completed.

3. The information processing apparatus according to claim 2, wherein the processor is configured to decrease the clock frequency used in the reconfiguration of the second circuit in a case where it is predicted that completion of the reconfiguration of the second circuit is earlier than completion of the process of the first circuit.

4. The information processing apparatus according to claim 2, wherein the processor is configured to increase the clock frequency used in the reconfiguration of the second circuit in a case where it is predicted that completion of the process of the first circuit is earlier than completion of the reconfiguration of the second circuit.

5. The information processing apparatus according to claim 3, wherein the processor is configured to increase the clock frequency used in the reconfiguration of the second circuit in a case where it is predicted that completion of the process of the first circuit is earlier than completion of the reconfiguration of the second circuit.

6. The information processing apparatus according to claim 1, wherein the processor is configured to adjust the clock frequency used in the process of the first circuit so that the time point at which the process of the first circuit is completed becomes closer to the time point at which the reconfiguration of the second circuit is completed.

7. The information processing apparatus according to claim 6, wherein the processor is configured to increase the clock frequency used in the process of the first circuit in a case where it is predicted that completion of the reconfiguration of the second circuit is earlier than completion of the process of the first circuit.

8. The information processing apparatus according to claim 6, wherein the processor is configured to decrease the clock frequency used in the process of the first circuit in a case where it is predicted that completion of the process of the first circuit is earlier than completion of the reconfiguration of the second circuit.

9. The information processing apparatus according to claim 7, wherein the processor is configured to decrease the clock frequency used in the process of the first circuit in a case where it is predicted that completion of the process of the first circuit is earlier than completion of the reconfiguration of the second circuit.

10. The information processing apparatus according to claim 1, wherein the processor is configured to adjust a heat exchange amount of a cooler that cools the processor in response to adjustment of the at least one of the clock frequencies.

11. The information processing apparatus according to claim 2, wherein the processor is configured to adjust a heat exchange amount of a cooler that cools the processor in response to adjustment of the at least one of the clock frequencies.

12. The information processing apparatus according to claim 3, wherein the processor is configured to adjust a heat exchange amount of a cooler that cools the processor in response to adjustment of the at least one of the clock frequencies.

13. The information processing apparatus according to claim 4, wherein the processor is configured to adjust a heat exchange amount of a cooler that cools the processor in response to adjustment of the at least one of the clock frequencies.

14. The information processing apparatus according to claim 5, wherein the processor is configured to adjust a heat exchange amount of a cooler that cools the processor in response to adjustment of the at least one of the clock frequencies.

15. The information processing apparatus according to claim 6, wherein the processor is configured to adjust a heat exchange amount of a cooler that cools the processor in response to adjustment of the at least one of the clock frequencies.

16. The information processing apparatus according to claim 7, wherein the processor is configured to adjust a heat exchange amount of a cooler that cools the processor in response to adjustment of the at least one of the clock frequencies.

17. The information processing apparatus according to claim 8, wherein the processor is configured to adjust a heat exchange amount of a cooler that cools the processor in response to adjustment of the at least one of the clock frequencies.

18. The information processing apparatus according to claim 9, wherein the processor is configured to adjust a heat exchange amount of a cooler that cools the processor in response to adjustment of the at least one of the clock frequencies.

19. The information processing apparatus according to claim 10, wherein:
the cooler is a blower that blows air to the processor, and
the processor is configured to increase an amount of blown air of the blower when increasing the clock frequency.

20. A non-transitory computer readable medium storing a program causing a computer including a processor connected to a programmable logic circuit to execute a process, the process comprising:
allowing a first circuit reconfigured in a first region of the programmable logic circuit to execute a process;
in parallel with the process of the first circuit, allowing a second circuit to be reconfigured in a second region different from the first region; and
adjusting at least one of a clock frequency used in the process of the first circuit and a clock frequency used in reconfiguration of the second circuit so that a time point at which the process of the first circuit is completed and a time point at which the reconfiguration of the second circuit is completed will become closer to each other.

* * * * *